(12) United States Patent
Doi et al.

(10) Patent No.: US 7,363,556 B2
(45) Date of Patent: Apr. 22, 2008

(54) TESTING APPARATUS AND TESTING METHOD

(75) Inventors: Masaru Doi, Tokyo (JP); Shinya Sato, Tokyo (JP)

(73) Assignee: Advantest Corporation, Tokyo (JP)

( * ) Notice: Subject to any disclaimer, the term of this patent is extended or adjusted under 35 U.S.C. 154(b) by 220 days.

(21) Appl. No.: 11/298,562

(22) Filed: Dec. 9, 2005

(65) Prior Publication Data
US 2007/0136628 A1    Jun. 14, 2007

(51) Int. Cl.
*G11C 29/00* (2006.01)
(52) U.S. Cl. .............................. 714/718; 714/5; 714/8; 714/42; 714/54; 714/721; 714/742; 714/744; 714/745; 714/814; 714/815; 365/185.01; 365/185.03; 365/201
(58) Field of Classification Search ...................... None
See application file for complete search history.

(56) References Cited

U.S. PATENT DOCUMENTS

| | | | | |
|---|---|---|---|---|
| 5,436,913 A | * | 7/1995 | Yamamura et al. | 714/719 |
| 5,778,440 A | * | 7/1998 | Yiu et al. | 711/154 |
| 6,574,168 B2 | * | 6/2003 | Hayashi | 368/118 |
| 2001/0052097 A1 | * | 12/2001 | Miura | 714/744 |

FOREIGN PATENT DOCUMENTS

| | | | |
|---|---|---|---|
| JP | 1-120000 | | 5/1989 |
| JP | 01-120000 | * | 5/1989 |
| JP | 3135673 | * | 2/2001 |
| JP | 2001-319493 | | 11/2001 |
| JP | 2002-202350 | * | 7/2002 |
| JP | 2003-58842 | | 2/2003 |

OTHER PUBLICATIONS

Japanese PCT/JP2006/323470, Feb. 6, 2007, a translation of Mitsubishi Electric, JP 01-120000 above.*
Japanese PCT International Search Report for PCT/JP2006/323470, dated Feb. 6, 2007, and English translation thereof, 16 pages.

* cited by examiner

*Primary Examiner*—John P Trimmings
(74) *Attorney, Agent, or Firm*—Osha Liang LLP

(57) ABSTRACT

A testing apparatus for testing a memory-under-test includes a writing section for writing preset test data into each page of said memory-under-test to test said memory-under-test and a fail memory unit for storing the test result of said memory-under-test. The fail memory unit includes a write time measuring section for measuring a write time required for writing said test data per each of said pages, an integrating section for integrating said write time across a plurality of said pages set in advance, and a judging section for judging whether or not said memory-under-test is defect-free by comparing a value integrated by said integrating section with an expected value set in advance. The integrating section further integrates said write time per page group having said predetermined number of pages. The judging section further judges whether or not said page group is defect-free based on an integral value of said write time per said page group.

12 Claims, 12 Drawing Sheets

| PAGE BLOCK | PAGE GROUP | PAGE | WRITE TIME | DIFFERENCE | INTEGRAL VALUE | FIRST JUDGMENT | SECOND JUDGMENT | BLOCK MASK |
|---|---|---|---|---|---|---|---|---|
| 1 | 1 | 1 | 560 μs | −40 μs | −40 μs | | 0 | |
| | | 2 | 1020 μs | +420 μs | +380 μs | 0 | 1 | |
| | | ⋮ | ⋮ | ⋮ | ⋮ | | ⋮ | |
| | | 16 | 560 μs | −40 μs | −20 μs | | 0 | 1 |
| | 2 | 17 | 560 μs | −40 μs | −40 μs | | 0 | |
| | | 18 | 540 μs | −60 μs | −100 μs | 0 | 0 | |
| | | ⋮ | ⋮ | ⋮ | ⋮ | | ⋮ | |
| | | 32 | 560 μs | −40 μs | −100 μs | | 0 | |
| 2 | 3 | 33 | 620 μs | +20 μs | +20 μs | | 0 | 0 |
| | | 34 | 640 μs | +40 μs | +60 μs | 0 | 0 | |
| | | ⋮ | ⋮ | ⋮ | ⋮ | | ⋮ | |
| | | 48 | 620 μs | +20 μs | −20 μs | | 0 | |
| | 4 | 49 | 580 μs | −20 μs | −20 μs | | 0 | |
| | | 50 | 620 μs | +20 μs | 0 μs | 0 | 0 | |
| | | ⋮ | ⋮ | ⋮ | ⋮ | | ⋮ | |
| | | 64 | 620 μs | +20 μs | 0 μs | | 0 | |
| 3 | 5 | 65 | 560 μs | −40 μs | −40 μs | | 0 | |
| | | 66 | 620 μs | +20 μs | −20 μs | 0 | 0 | |
| | | ⋮ | ⋮ | ⋮ | ⋮ | | ⋮ | |
| | | 80 | 640 μs | +40 μs | −20 μs | | 0 | 1 |
| | 6 | 81 | 560 μs | −40 μs | −40 μs | | | |
| | | 82 | 620 μs | +20 μs | −20 μs | 1 | | |
| | | ⋮ | ⋮ | ⋮ | ⋮ | | | |
| | | 96 | 620 μs | +20 μs | +40 μs | | | |

FIG. 8

| PAGE GROUP | PAGE | WRITE TIME | DIFFERENCE | INTEGRAL VALUE | FIRST JUDGMENT | SECOND JUDGMENT | MASK |
|---|---|---|---|---|---|---|---|
| 1 | 1 | 600 μs | 0 μs | 0 μs | 0 | 0 | 0 |
| | 2 | 620 μs | +20 μs | +20 μs | | 0 | 0 |
| | ... | ... | ... | ... | | ... | ... |
| | 8 | 600 μs | 0 μs | −20 μs | | 0 | 0 |
| 2 | 9 | 600 μs | 0 μs | 0 μs | 0 | 0 | 0 |
| | 10 | 1560 μs | 960 μs | 0 μs | | 1 | 1 |
| | ... | ... | ... | ... | | ... | ... |
| | 16 | 620 μs | +20 μs | −40 μs | | 0 | 0 |
| | 17 | 600 μs | 0 μs | −40 μs | | 0 | 0 |
| 3 | 18 | 620 μs | +20 μs | +20 μs | 1 | 0 | 1 |
| | 19 | 640 μs | +40 μs | +40 μs | | 0 | 1 |
| | ... | ... | ... | ... | | ... | ... |
| | 25 | 620 μs | +20 μs | +120 μs | | 0 | 1 |

FIG. 10

TESTING APPARATUS AND TESTING METHOD

BACKGROUND OF THE INVENTION

1. Field of the Invention

The present invention relates to a testing apparatus and a testing method for testing a memory-under-test such as a semiconductor memory.

More specifically, the invention relates to a testing apparatus for conducting a writing test of the memory-under-test.

2. Related Art

Conventionally, as a semiconductor memory, there have been known a flash memory and the like. While the semiconductor memory may be used for various uses, it requires a certain data write time in accordance to its use. Here, the data write time means a time required for finishing a writing process of predetermined data in writing the data into the semiconductor memory.

A case of using such semiconductor memory for storing image data of a digital video camera will be explained below for example. In transferring data of VGA image (about 310,000 pixels) in shooting video image, its data amount per frame is about 5 Mb. The data amount per frame is reduced to 242 Kb for example by compressing the data.

When a number of frames of the video image is supposed to be 30 frame per second, a transfer time per frame is about 33 ms. However, because the data transfer time contains a time for verifying operation and the like, all of that time cannot be used for writing data. Then, 8 ms in the transfer time of each frame is appropriated to the time for writing data for example. That is, in the case described above, it is necessary to be able to write the data of 242 Kb to the semiconductor memory per 8 ms.

If a storage capacity of the semiconductor memory per page is 2 KB, 15 pages are necessary in order to store the data of one frame. Accordingly, in the case described above, the semiconductor memory is required to be able to write 15 pages in 8 ms.

There has been known a test for measuring the data writing time as described above as an item for testing a memory-under-test such as the semiconductor memory. In this test, predetermined data is written into each page of the memory-under-test to measure the write time per page.

In the conventional testing apparatus, the write time per page is specified as a testing specification. For the semiconductor memory that is required to be able to write 15 pages in 8 ms like the case described above, 8 ms/15=530 µs is specified as the write time per page.

Then, when the write time per page is larger than the specified value, a block containing that page is judged to be a defective block. The block is a unit in writing data and 15 pages is assumed to be one block for example in this case.

Writing of data into the defective block is inhibited when the defective block is packaged. The memory-under-test having such defective blocks by a certain number or more is discriminated as a defective product.

Semiconductor memories that meet with the specification required in packaging are selected through such test.

However, while the specification required in packaging demands to be able to write 15 pages in 8 ms, the conventional test demands to be able to write each page in 530 µs. The specified value in the conventional test is equal to the specification required in packaging when seen from the point of view of unit of block.

However, the write time per page of the semiconductor memory is not constant and varies per page. Therefore, the condition of the specified value required in the conventional test is harder than the specification required in packaging. That is, while the specification required in packaging demands an average write time of the pages contained in the block to be 530 µs or less for example, the conventional test demands the write time of all of the pages contained in the block to be 530 µs or less.

As a result, the conventional test ends up rejecting such a semiconductor memory that is supposed to have no problem in packaging, as a defective product. Due to that, the conventional test is dropping the production yield of semiconductor memories.

Accordingly, it is an object of the invention to provide a testing apparatus and a testing method that are capable of solving the above-mentioned problem. This object may be achieved through the combination of features described in independent claims of the invention.

Dependent claims thereof specify preferable embodiments of the invention.

SUMMARY OF THE INVENTION

In order to solve the above-mentioned problem, a first aspect of the invention provides a testing apparatus for testing a memory-under-test, having a writing section for writing preset test data into each page of the memory-under-test to test the memory-under-test and a fail memory unit for storing the test result of the memory-under-test, wherein the fail memory unit further includes a write time measuring section for measuring a write time required for writing the test data per page, an integrating section for integrating the write time across a plurality of pages set in advance and a judging section for judging whether or not the memory-under-test is defect-free by comparing a value integrated by the integrating section with an expected value set in advance.

The integrating section may integrate the write time per page group having a number of pages set in advance and the judging section may judge whether or not the page group is defect-free based on an integral value of the write time per page group.

The fail memory unit may further include a fail memory for storing the judgment result for each page group while correlating with each page group. The fail memory unit may further include a subtracting section for inputting a differential value obtained by subtracting an average specification value set in advance from the write time to each page measured by the write time measuring section to the integrating section and the judging section may judge whether or not each page group is defect-free based on whether or not an integral value of the differential value is smaller than zero.

The judging section may include a first judger for judging whether or not the integral value of the write time to each page group is larger than an integral expected value set in advance per page group and a second judger for judging whether or not the write time to each page contained in each page group is larger than an absolute specification value set in advance.

The judging section may further include a third judger for judging, for each page group, that the page group is a defect-free block when the integral value of the write time is smaller than the integral expected value and the write time of all of the pages contained in the page group is smaller than the absolute specification value.

The fail memory unit may further include an integral expected value register for storing the integral expected value in advance to feed to the first judger and an absolute specification value register for storing the absolute specification value in advance to feed to the second judger.

The fail memory unit may further include a page group control section for enabling the integrating section to integrate while excluding the write time of that page and for incrementing a page number of the last page in the page group by one when the second judger judges that the write time of either one of the pages is larger than the absolute specification value.

The fail memory unit may further include a third judger that judges, for each page, that the pertinent page is defect-free when the integral value of the page group to which the page belongs is judged to be less than the integral expected value and the write time is judged to be less than the absolute specification value and a fail memory for storing the judgment result for each page by correlating with the page.

The fail memory unit may further include a page number register for storing the page number set in advance, a counter for counting a number of pulses of an enable signal synchronized almost with a write cycle of the test data of the writing section and a resetting section for resetting the integral value of the integrating section and the counted value of the counter when the counted value of the counter coincides with the page number stored in the page number register, and when the write time of either one of the pages is judged to be larger than the absolute specification value by the second judger, the page group control section may stop the counter from counting by one pulse of the enable signal and may inhibit the integrating section from integrating the write time of that page.

The fail memory unit may further include first and second integrating sections provided in parallel, and the first page group for which the first integrating section integrates the write time and the second page group for which the second integrating section integrates the write time may have pages partially overlapping each other.

The judging section may judge that the memory-under-test is defect-free when all of the values integrated by the first and second integrating sections are smaller than the expected value.

A second aspect of the invention provides a testing method for testing a memory-under-test, having a writing step of writing preset test data to each page of the memory-under-test to test the memory-under-test and a storage step of storing the test result of the memory-under-test, wherein the storage step further has a write time measuring step of measuring a write time required for writing the test data per each of the pages, an integration step of integrating the write time across the plurality of pages set in advance and a judging step of judging whether or not the memory-under-test is defect-free by comparing the value integrated in the integration step with an expected value set in advance.

It is noted that the summary of the invention described above does not necessarily describe all necessary features of the invention. The invention may also be a sub-combination of the features described above.

BRIEF DESCRIPTION OF THE DRAWINGS

FIGS. 4A and 4B are charts showing exemplary test results, wherein FIG. 4A shows the test result of a conventional testing apparatus and FIG. 4B shows the test result of the testing apparatus explained in connection with FIGS. 1 through 3.

FIG. 8 is a table showing one exemplary operation of the fail memory unit explained in connection with FIG. 7.

FIG. 10 is a table showing one exemplary operation of the fail memory unit explained in connection with FIG. 9.

DETAILED DESCRIPTION OF THE INVENTION

The invention will now be described based on preferred embodiments, which do not intend to limit the scope of the invention, but exemplify the invention. All of the features and the combinations thereof described in the embodiments are not necessarily essential to the invention.

Figure 1:
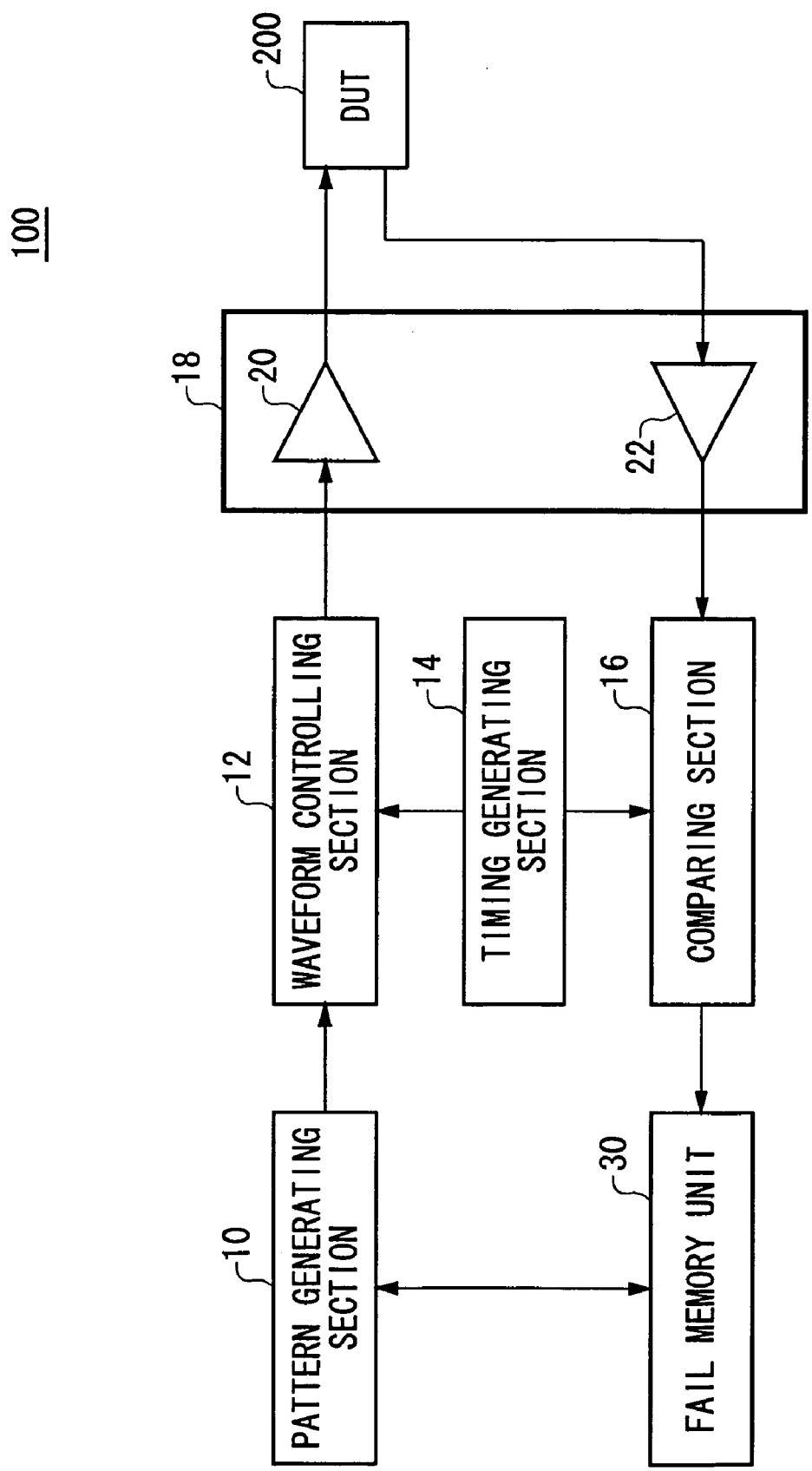
FIG. 1 is a diagram showing one exemplary configuration of a testing apparatus according to an embodiment of the invention.

FIG. 1 is a diagram showing one exemplary configuration of a testing apparatus 100 according an embodiment of the invention. The testing apparatus 100 is an apparatus for testing a memory-under-test (MUT) 200 such as a semiconductor memory and has a pattern generating section 10, a waveform control section 12, a timing generating section 14, a comparator 16, a pin electronics section 18 and a fail memory unit 30.

The pattern generating section 10 generates a test pattern for testing the MUT 200 in accordance to a program set by a user for example.

Signals and the like inputted to the MUT 200 are generated based on the test pattern.

Based on the test pattern fed from the pattern generating section 10, the waveform control section 12 generates a test signal to be inputted to the MUT 200. For example, the waveform control section 12 generates a test signal indicating voltage level corresponding to the test pattern in synchronism with a timing clock fed from the timing generating section 14. The timing generating section 14 generates the timing clock to be inputted to the waveform control section 12.

The pin electronics section 18 transmits/receives signals to/from the MUT 200. The pin electronics section 18 has a driver 20 and a comparator 22. The driver 20 inputs the test signal generated by the waveform control section 12 to the MUT 200. In measuring a data write time of the MUT 200 for example, the pattern generating section 10, the waveform control section 12 and the driver 20 function as a writing section for writing test data set in advance into each page of the MUT 200 to test the MUT 200.

The comparator 22 receives a signal outputted out of the MUT 200.

The comparator 16 converts the output signal of the MUT 200 into a binary signal by comparing whether or not signal level of the output signal is larger than a preset reference voltage level. The comparator 16 compares the signal level of the output signal with the reference voltage level corresponding to the timing signal fed from the timing generating section 14. The comparator 16 may also compare the output signal converted into the binary signal with an expected value signal fed as described later.

In measuring the data write time of the MUT 200 or example, the comparator 16 receives a ready/busy signal (hereinafter referred to as a RY/BY signal) of the MUT 200 as the output signal and detects whether or not the RY/BY signal indicates a predetermined expected value.

The RY/BY signal is a signal that indicates a first logical value during a writing process of the input data and indicates a second logical value when it become ready to write next input data by finishing the writing process of the input data.

Then it becomes possible to measure the data write time of each page of the MUT 200 by measuring a time when the RY/BY signal indicates the second logical value from the start of writing of the input data into each page of the MUT 200. The fail memory unit 30 may carry out this measurement for example.

The fail memory unit 30 stores the test result of the MUT 200.

For example, the fail memory unit 30 stores the data write time per page described above.

Figure 2:
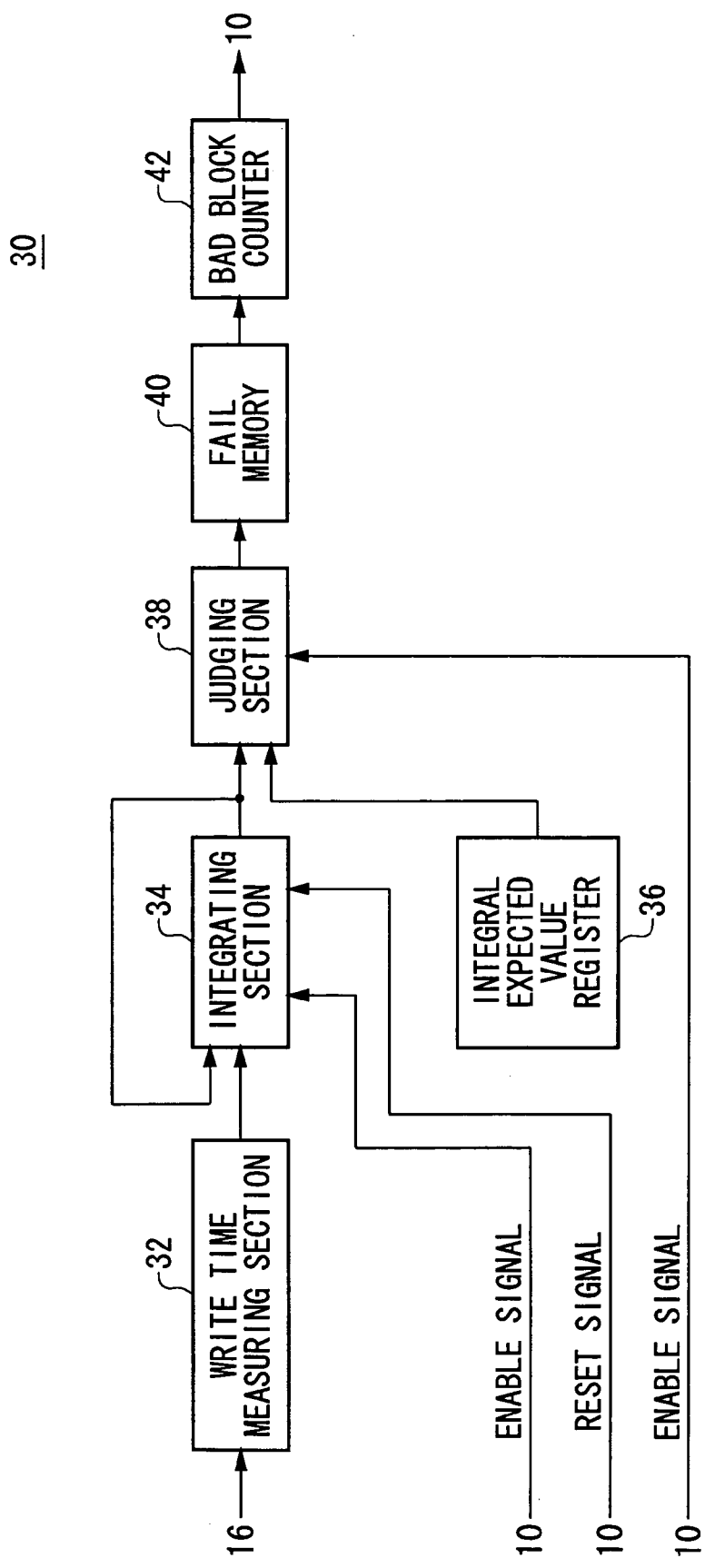
FIG. 2 is a diagram showing one exemplary configuration of a fail memory unit.

FIG. 2 is a diagram showing one exemplary configuration of the fail memory unit 30. When preset test data is written into each page of the MUT 200, the fail memory unit 30 measures and stores the time required for writing the test data. The fail memory unit 30 of this embodiment has a write time measuring section 32, an integrating section 34, an integral expected value register 36, a judging section 38, a fail memory 40 and a bad block counter 42.

The write time measuring section 32 measures the write time required for writing the test data per page. The write time measuring section 32 may measure the write time based on the comparison result of the comparator 16. For example, the write time measuring section 32 may receive a notice from the pattern generating section 10 that writing of the test data is started and may measure a period of time until when the RY/BY signal indicates the second logical value after receiving the notice. This measurement may be carried out by counting a system clock or the like of the testing apparatus 100 during that period of time for example.

The integrating section 34 integrates the write time measured by the write time measuring section 32 across a plurality of pages set in advance. For example, the integrating section 34 may integrate the write time per page group having a preset number of pages. The page group may be a page block set in advance for the MUT 200. A number of pages contained in each page block may be determined in accordance to a specification of the MUT 200 required in packaging it.

The pattern generating section 10 feeds an enable signal and a reset signal to the integrating section 34. The enable signal is a signal for controlling whether the integration of write time should be permitted or inhibited and the reset signal is a signal for initializing an integral value of write time in the integrating section 34. For example, the pattern generating section 10 may permit the integrating section 34 to integrate the write time in carrying out the test for measuring the write time. The pattern generating section 10 also initializes the integral value in the integrating section 34 every time when a write time of a page group is integrated.

The judging section 38 judges whether or not the MUT 200 is defect-free by comparing the value integrated by the integrating section 34 with the expected value set in advance. For example, the judging section 38 may judge whether or not the page group is defect-free based on the integral value of the write time per page group. In this case, the integral expected value register 36 stores the integral expected value per page group. The judging section 38 may judge that the page group is defective when the write time integrated by the integrating section 34 is larger than the integral expected value.

The pattern generating section 10 feeds an enable signal also to the judging section 38. This enable signal is a signal for controlling whether or not the judging section 38 is enabled to judge whether or not the page group is defect-free. When the integrating section 34 integrates the write time of a predetermined number of pages for example, the pattern generating section 10 may enable the judging section 38 to compare the integral value with the integral expected value.

The fail memory 40 stores the judgment result of each page group while correlating with each page group. For example, each address of the fail memory 40 corresponds to each page group of the MUT 200 and the fail memory 40 stores each judgment result in the corresponding address. The pattern generating section 10 may control the fail memory 40 in which address it stores the judgment result for example. The judgment result stored in the fail memory 40 may be used as mask data of the corresponding page group. For example, it is possible to inhibit the use of the defective page group by using the judgment result in actually using the MUT 200.

It is also possible to omit a test of the defective page group in testing the MUT 200.

The bad block counter 42 counts a number of page groups judged to be defective by the judging section 38. When the counted value becomes larger than a certain value set in advance, the bad block counter 42 notifies the pattern generating section 10 of that. Receiving that notice, the pattern generating section 10 stops the test of the MUT 200.

Such configuration enables the test conforming to the specification required in actually using the MUT 200 to be carried out.

Therefore, it can improve the yield of the MUT 200 as compared to the conventional testing apparatus.

Figure 3:
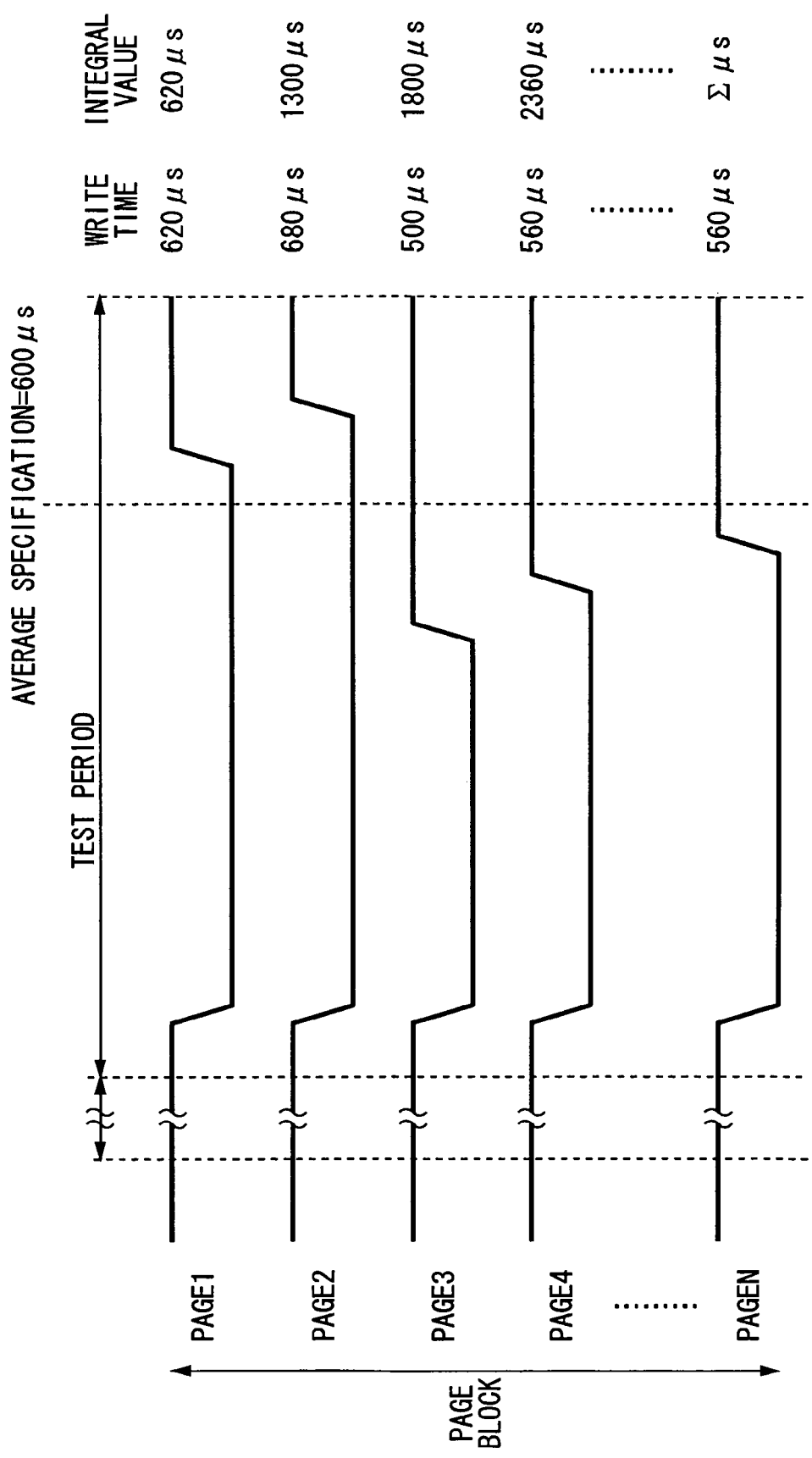
FIG. 3 is a chart showing one exemplary operation of the fail memory unit explained in connection with FIG. 2.

FIG. 3 is a chart showing one exemplary operation of the fail memory unit 30 explained in connection with FIG. 2. A waveform of each page in FIG. 3 is one exemplary waveform of the RY/BY signal when test data is written into that page. In this example, the RY/BY signal indicates a logic L during the test data writing process and indicates a logic H when it becomes ready to write the next test data after finishing the test data writing process.

In this example, each page group (page block) has N pages, respectively. Still more, an integral expected value for one page group is assumed to be N×600 µs in this example. In this case, the conventional testing apparatus judges that the page group is defect-free when the data write time of all of the pages is 600 µs or less. The data write time of the page 1 and page 2 is larger than 600 µs in the example shown in FIG. 3, so that the conventional testing apparatus judges that this page group is defective.

In contrary to that, the fail memory unit 30 explained in connection with FIG. 2 integrates the data write time of the pages contained in the respective page groups and compares the integral value Σ with the integral expected value N×600 µs. Therefore, even if the page group contains a page whose data write time is larger than the average value (600 µs in this example) per page of the integral expected value, the page group is judged to be defect-free if the data write time of the whole page group is smaller than the integral expected value.

Figure 4A:
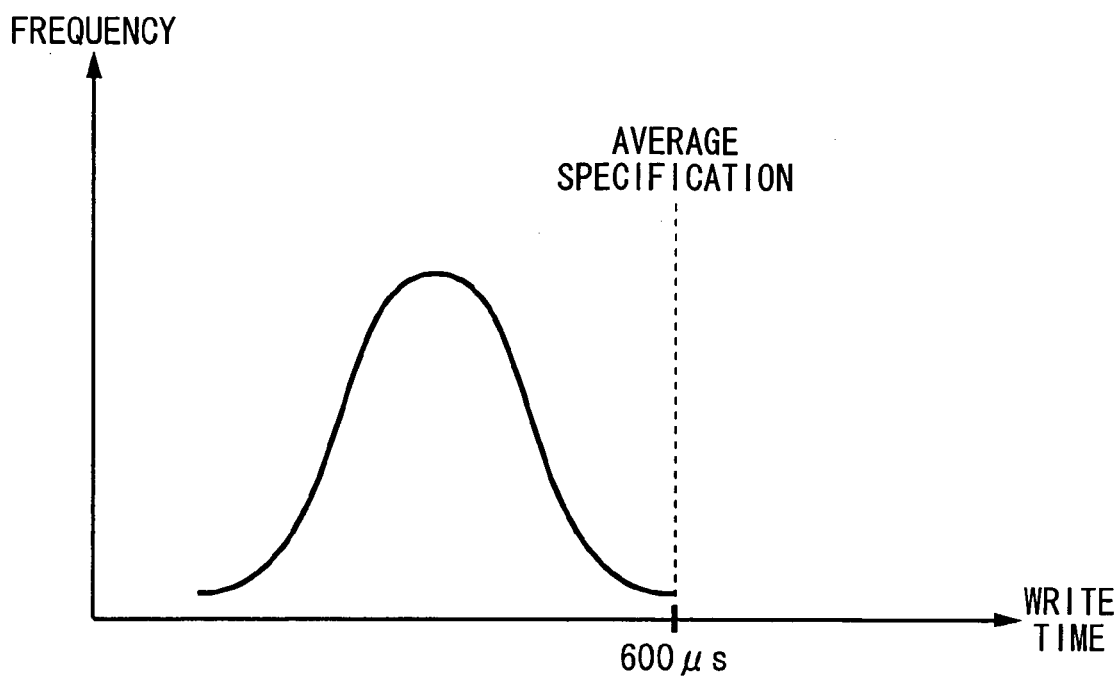
Figure 4B:
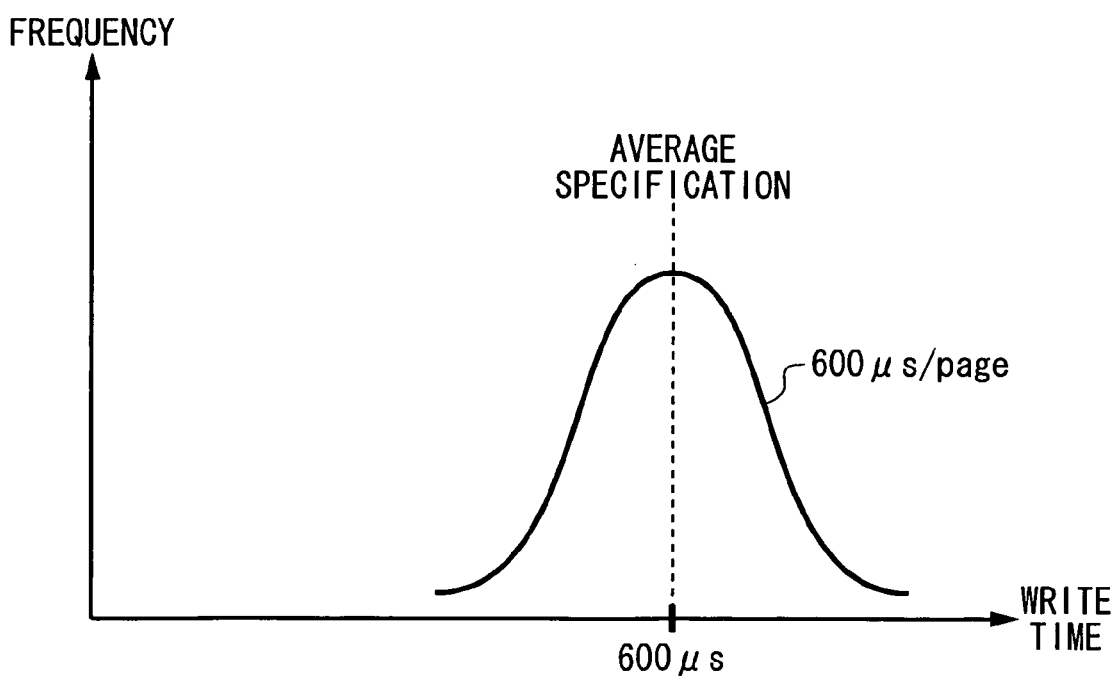

FIGS. 4A and 4B are charts showing exemplary test results, wherein FIG. 4A shows the test result of the conventional testing apparatus and FIG. 4B shows the test result of the testing apparatus 100 explained in connection with FIGS. 1 through 3.

In FIGS. 4A and 4B, an axis of abscissa represents the data write time of each page and an axis of ordinate represents a number of pages corresponding to each data write time.

As shown in FIG. 4A, the conventional testing apparatus requires the write time of all of the pages to be a value obtained by dividing the expected value of write time of the whole page group by the number of pages, e.g., 600 µs or less, for example. Therefore, even if the write time required in actual use is met as the whole page group, there has been a case when the page group is judged to be defective.

In contrary to that, the testing apparatus 100 compares an average value of the write time of the pages contained in the page group with a value obtained by dividing the expected value of the write time of the whole page group by a number of pages. Therefore, the testing apparatus 100 can accurately select the semiconductor memories that meet with the write time required in actual use as the whole page group.

Figure 5:
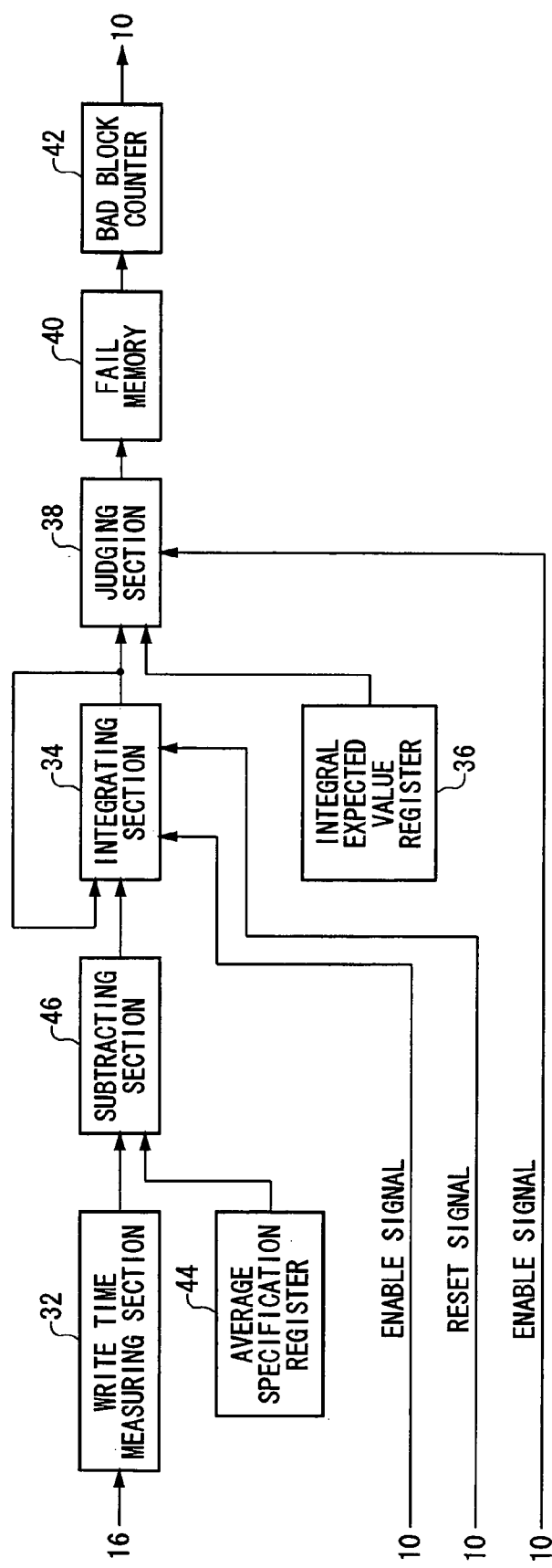
FIG. 5 is a diagram showing another exemplary configuration of the fail memory unit.

FIG. 5 is a diagram showing another exemplary configuration of the fail memory unit 30. The fail memory unit 30 of this embodiment has an average specification register 44 and a subtracting section 46 in addition to the configuration of the fail memory unit 30 shown in FIG. 2. The other components have the same functions with the components denoted by the same reference numerals in FIG. 2.

The average specification register 44 stores an average specification value set in advance. The average specification value is a value obtained by dividing an expected value set in advance for the integrated write time of the page group by a number of pages contained in the page group.

The subtracting section 46 calculates a differential value by subtracting the average specification value from the write time to each page measured by the write time measuring section 32 and inputs it to the integrating section 34. When the data write time of a certain page is 580 µs and the average specification value is 600 µs for example, the subtracting section 46 inputs −20 µs to the integrating section 34 as the differential value of the write time of that page.

Still more, in this case, the integral expected value register 36 stores 0 µs as the integral expected value. That is, the judging section 38 judges whether or not each page group is defect-free based on whether or not the integral value of the differential values calculated by the integrating section 34 is smaller than zero.

The fail memory unit 30 of the present embodiment can reduce the value inputted to the integrating section 34. That is, it can reduce a bit number of the value calculated by the integrating section 34.

Therefore, it enables the circuit scale of the integrating section 34 and others to be reduced.

Figure 6:
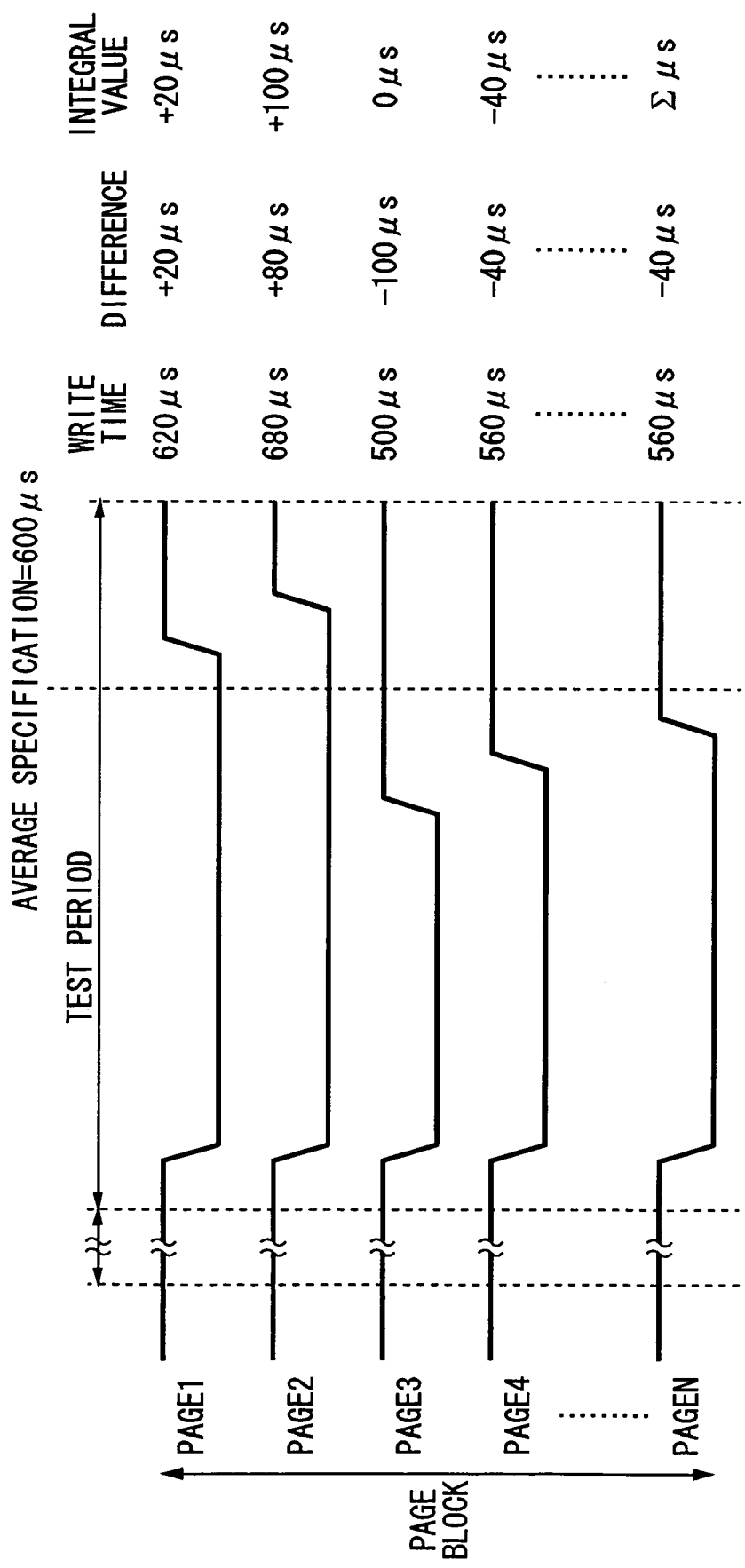
FIG. 6 is a chart showing one exemplary operation of the fail memory unit explained in connection with FIG. 5.

FIG. 6 is a chart showing one exemplary operation of the fail memory unit 30 explained in connection with FIG. 5. The fail memory unit 30 subtracts the average specification value from the data write time of each page and integrates the differential value as described above. Therefore, it is capable of reducing the bit number of the data (differential value) inputted to the integrating section 34 and the bit number of the data (integral value) outputted out of the integrating section 34.

Figure 7:
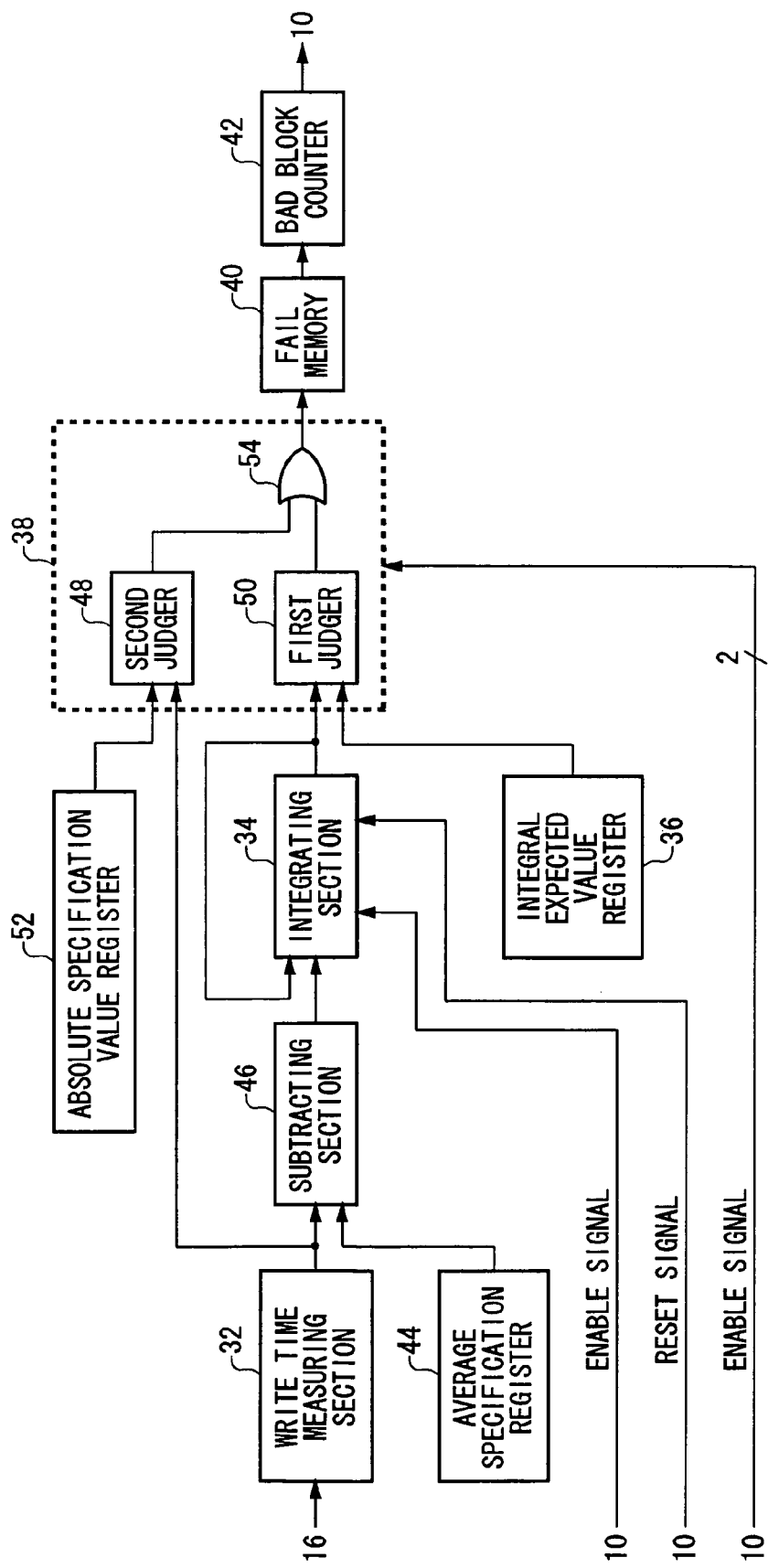
FIG. 7 is a diagram showing a still other exemplary configuration of the fail memory unit.

FIG. 7 is a diagram showing a still other exemplary configuration of the fail memory unit 30. The fail memory unit 30 of this embodiment has an absolute specification value register 52 in addition to the configuration of the fail memory unit 30 shown in FIG. 5.

Still more, the judging section 38 of this embodiment has a first judger 50, a second judger 48 and a third judger 54. The other components have almost the same functions with the components denoted by the same reference numerals in FIG. 5.

The absolute specification value register 52 stores an absolute specification value set in advance. The absolute specification value register 52 stores the absolute specification value that is larger than the average specification value. The integral value of write time of page group is questioned in the semiconductor memory such as the data flash memory as described above, so that normally the write time per page is not necessary. However, it is a problem from the point of view of design of a device if there exits a page that requires an obviously and abnormally large write time. It is because such page may have some structural failure.

Therefore, the fail memory unit 30 of this embodiment detects an abnormality of each page by using the absolute specification value to select a page that requires an abnormally large write time due to the structural failure. The second judger 48 judges whether or not each page is defect-free by judging whether or not the data write time of each page measured by the write time measuring section 32 is larger than the absolute specification value stored in the absolute specification value register 52.

Further, the first judger 50 judges per page group whether or not the integral value of the data write time to each page group is larger than the integral expected value set in advance. Then, for the respective page groups, the third judger 54 judges that the page group is a defect-free block when the integral value of the data write time is smaller than the integral expected value and the data write time of all of the pages contained in that page group is smaller than the absolute specification value. The third judger 54 also judges, for each page group, that the page group is a defective block when the integral value of the data write time is larger than the integral expected value or when the data write time of any page contained in the page group is larger than the absolute specification value.

FIG. 8 is a table showing one exemplary operation of the fail memory unit 30 explained in connection with FIG. 7. In FIG. 8, First Judgment indicates the judgment result of each page group in the first judger 50 and Second Judgment indicates the judgment result of each page in the second judger 48.

In this example, the MUT 200 has three page blocks, each page block has two page groups and each page group has 16 pages, respectively.

Still more, this example will be explained on the assumption that the integral expected value of data write time per page group is 16×600 µs and that the absolute specification value is 1000 µs. The fail memory unit 30 of this example judges the page block to be defect-free when all of the page groups contained in the page block are defect-free.

Whether or not the page group is defect-free is judged by the method explained in FIG. 2 through FIG. 7.

As shown in FIG. 8, the data write time of the second page is 1020 µs, which is larger than the absolute specification value. Therefore, Second Judgment corresponding to the second page becomes fail (logical value 1). In this case, this page group is judged to be a defective block even if the integral value of the data write time of the first page group is smaller than the integral expected value and First Judgment indicates Pass (logical value 0). Therefore, the first page block is judged to be a defective block and the fail memory 40 stores the logical value 1 as block mask data corresponding to this page block.

Still more, as shown in FIG. 8, the integral values of the data write time of the third and fourth page groups contained in the second page block are smaller than the integral expected value, respectively. The data write time of the pages contained in each page group is also smaller than the absolute specification value, respectively.

In this case, the both First and Second Judgments indicate Pass (logical value 0) and this page block is judged to be a defect-free block.

Still more, the integral value of the data write time of the sixth page group is larger than the integral expected value as shown in FIG. 8. In this case, the third page block containing this page group is judged to be a defective block. Such control allows the MUT 200 that meets with the specification required in the actual use and that is structurally defect-free to be selected.

Figure 9:
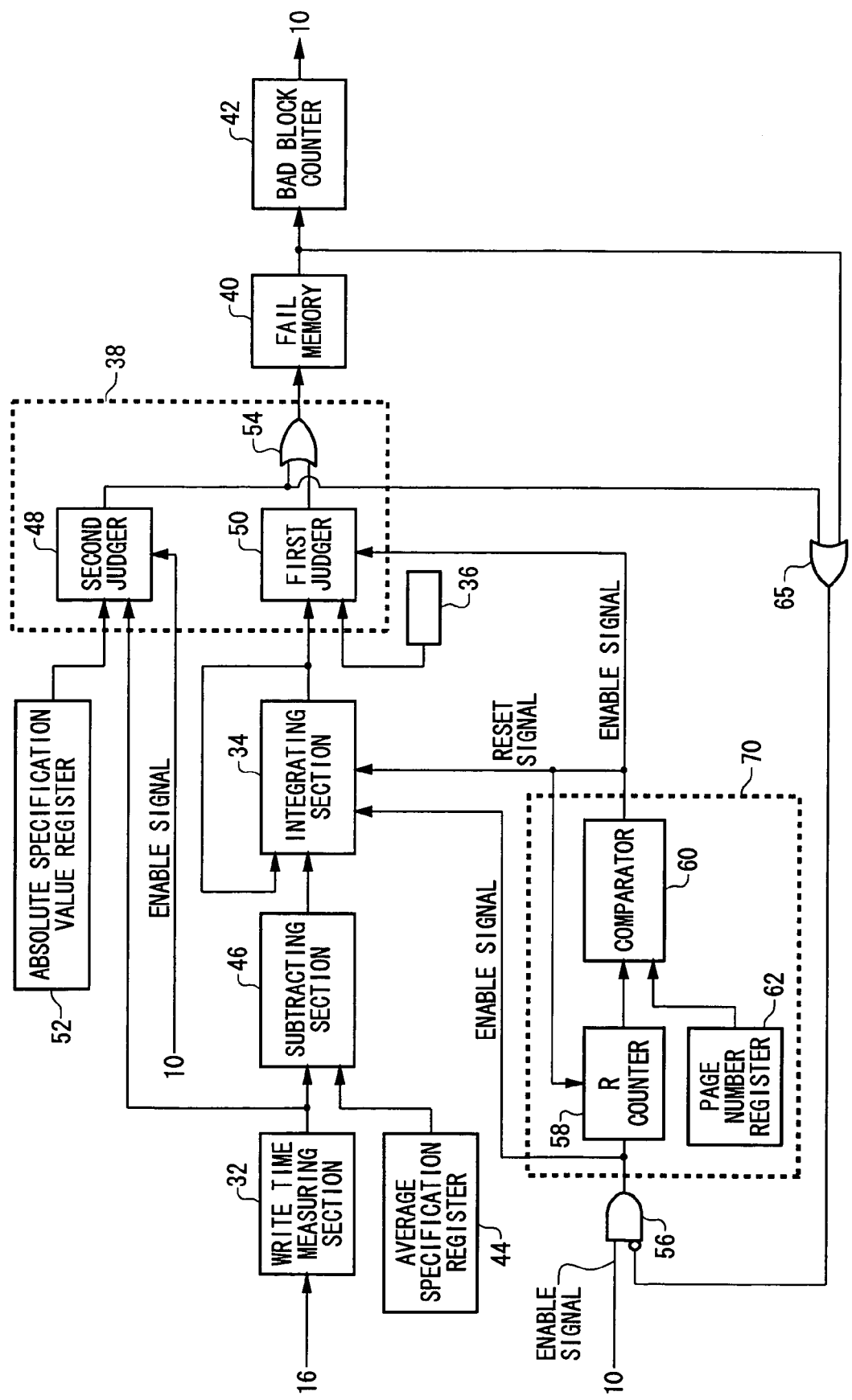
FIG. 9 is a diagram showing a still other exemplary configuration of the fail memory unit.

FIG. 9 is a diagram showing a still other exemplary configuration of the fail memory unit 30. The fail memory unit 30 of this embodiment has an AND circuit 56, a page group control section 70 and an OR circuit 65 in addition to the configuration of the fail memory unit 30 shown in FIG. 7. The other components have almost the same functions with the components denoted by the same reference numerals in FIG. 7.

When the second judger 48 judges that the data write time of either page is larger than the absolute specification value, the page group control section 70 causes the integrating section 34 to integrate while excluding the write time of that page and to increment the page number of the last page of that page group by one.

It also stores data masking that page to inhibit the use of that page. Even if a page contained in the page group partially has a trouble, the other pages having no problem may be effectively utilized by such configuration.

In this example, the page group control section 70 has a counter 58, a comparator 60 and a page number register 62. The page number register 62 stores page numbers to be contained in the page group.

When one page group contains 16 pages, the page number register 62 stores 16 as the page number.

The counter 58 counts the page number whose data write time has been measured by the write time measuring section 32. For example, the driver 20 inputs the test data to the MUT 200 with a writing cycle set in advance and the write time measuring section 32 measures the data write time of each page almost in synchronism with the writing cycle.

The counter 58 may count pulses of an enable signal specifying this writing cycle. The enable signal may be fed to the counter 58 via the AND circuit 56.

The comparator 60 enables the first judger 50 to carry out the judging process when the page number stored in the page number register 62 coincides with the counted value outputted out of the counter 58.

The comparator 60 also functions as a resetting section for resetting the counted value of the counter 58 and the integral value of the integrating section 34 to initial values when the page number stored in the page number register 62 coincides with the counted value outputted out of the counter 58. The first judgment using the integral value of the write time may be carried out through such control per predetermined page number, i.e., per page group.

The OR circuit 65 also sequentially receives the judgment result for each page in the second judger 48. The OR circuit 65 outputs OR of the judgment result and the mask data outputted out of the fail memory 40. This mask data may be data stored in advance for that page group.

For example, when the page group has been judged to be a defective block by a test previously carried out, the fail memory 40 stores Fail (logical value 1) as mask data for that page group. That is, the OR circuit 65 outputs the logical value 1 when at least either one of the judgment result of the second judger 48 for that page and the mask data for that page group indicates the logical value 1.

The AND circuit 56 outputs AND of a signal obtained by inverting a signal outputted out of the OR circuit 65 and the enable signal fed from the pattern generating section 10. That is, the AND circuit 56 outputs the logical value 0 when the OR circuit 65 outputs the logical value 1. The signal outputted out of the AND circuit 56 is used as an enable signal for controlling the integrating section 34 and the counter 58. That is, during when the OR circuit 65 outputs the logical value 1, the AND circuit 56 stops the counting process of the counter 58 and the integrating process of the integrating section 34.

When the second judger 48 judges that the data write time of either page is larger than the absolute specification value, it becomes possible to stop the counting process of the counter 58 by one pulse of the enable signal and to inhibit the integrating section 34 from integrating the write time of the page through such control. That is, it allows the page number of the last page of the page group to be incremented by one and allows the integrating section 34 to integrate while excluding the write time of that page.

FIG. 10 is a table showing one exemplary operation of the fail memory unit 30 explained in connection with FIG. 9. In FIG. 10, First Judgment indicates the judgment result for each page group of the first judger 50 and Second Judgment indicates the judgment result of each page of the second judger 48. A case when the MUT 200 has three page groups and a number of pages of each page group is 8 will be explained in this example. Still more, this example will be explained on the assumption that the integral expected value of data write time per page group is 8×600 μs and that the absolute specification value is 1000 μs.

As shown in FIG. 10, the data write time of the tenth page is 1560 μs and is larger than the absolute specification value. In this case, the fail memory unit 30 shown in FIG. 7 judges that the page group containing this page is defective. In contrary to that, the fail memory unit 30 shown in FIG. 9 judges that this page is defective and masks this page. At this time, the other pages contained in the page group are not masked.

Then, the fail memory unit 30 increments the page number of the last page of the page group containing this page by one (in this example, the fail memory unit 30 increments the last page of the second page group from the 16$^{th}$ page to the 17$^{th}$ page. Such process allows the pages having no problem to be utilized effectively.

Figure 11:
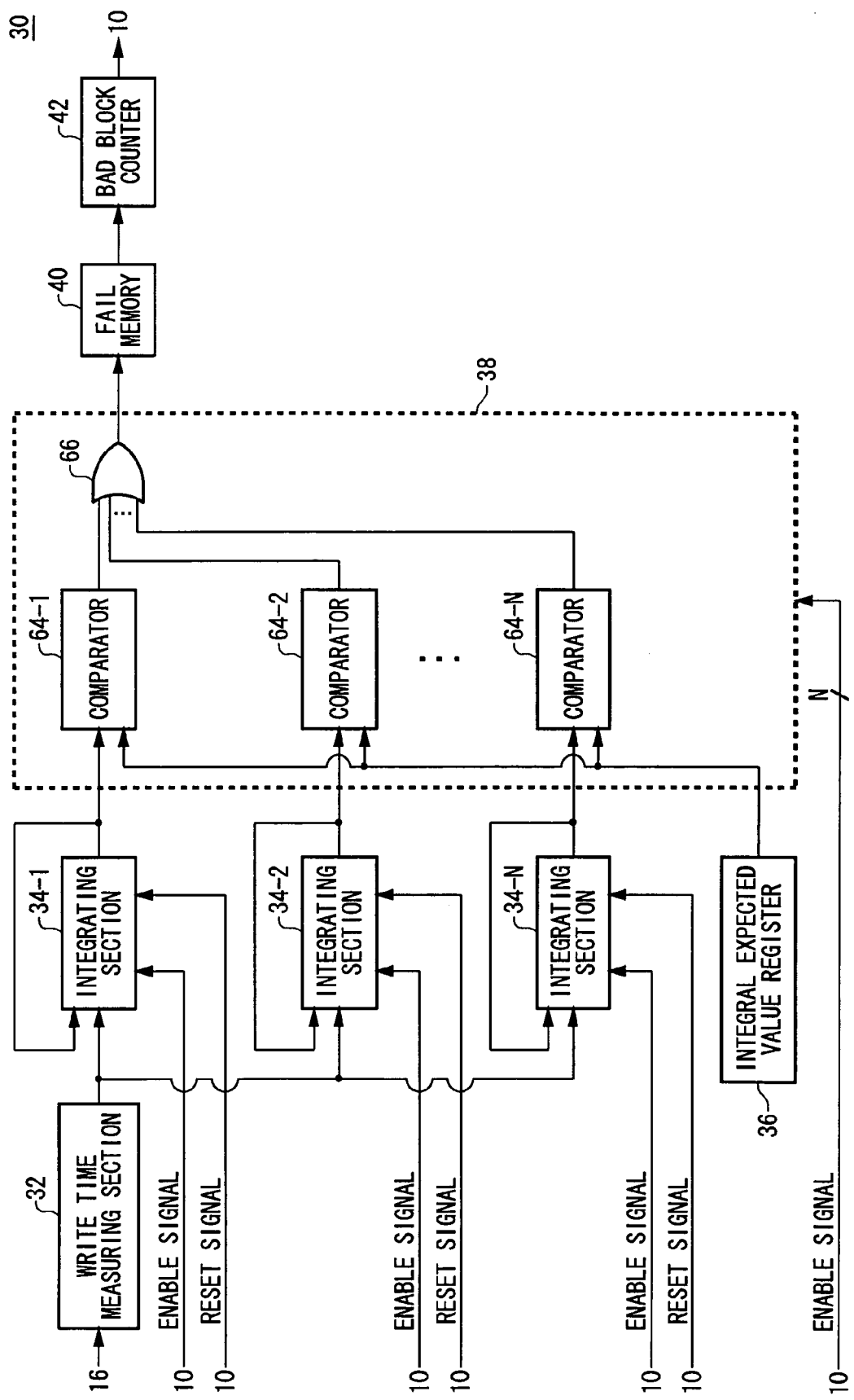
FIG. 11 is a diagram showing a still other configuration of the fail memory unit.

FIG. 11 is a diagram showing a still other configuration of the fail memory unit 30. The fail memory unit 30 of this embodiment has a plurality of integrating sections (34-1 through 34-N, generically referred to as 34 hereinafter) provided in parallel. The judging section 38 also has a plurality of comparators (64-1 through 64-N, generically referred to as 64 hereinafter) provided in parallel and an OR circuit 66.

Figure 12:
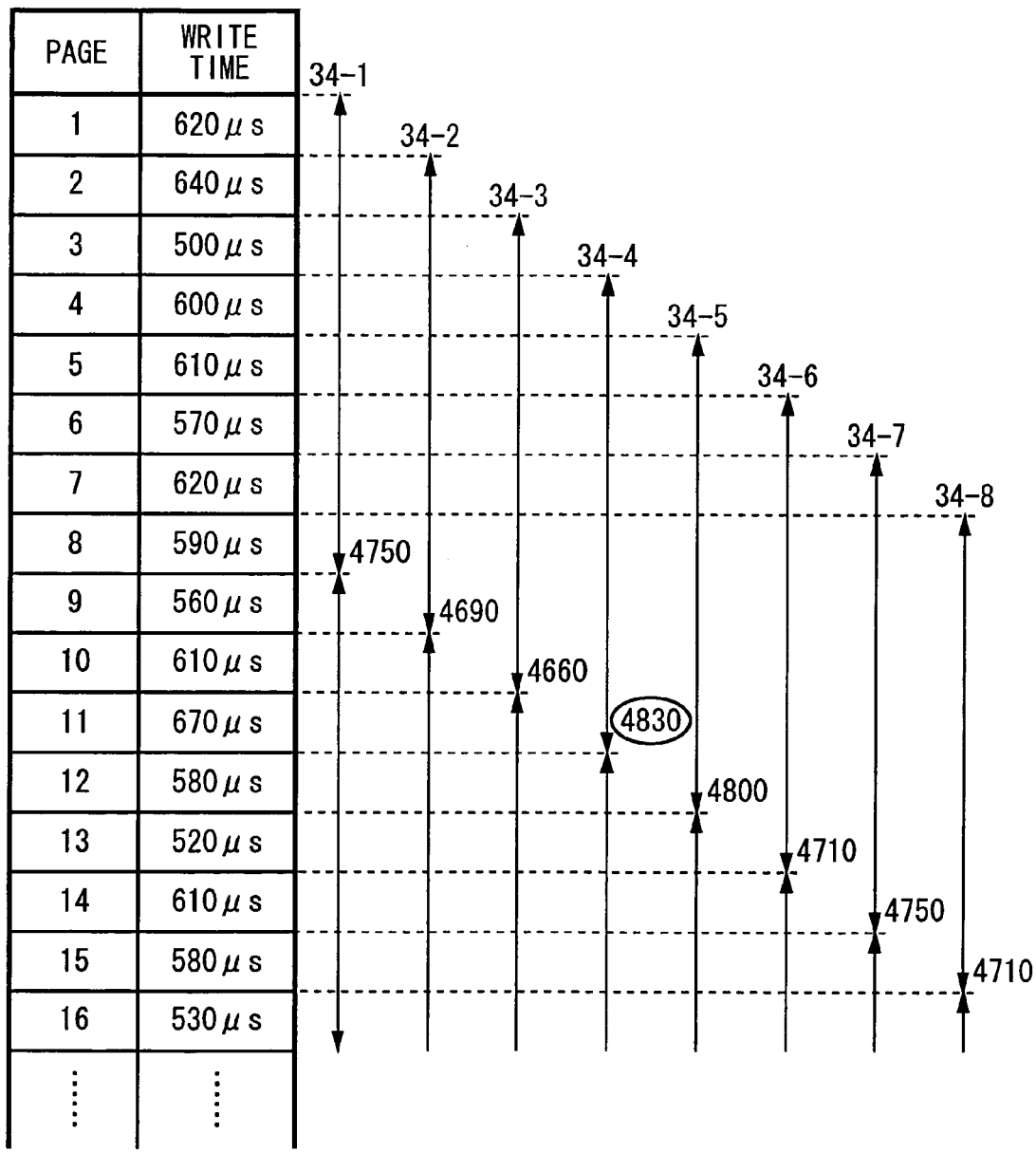
FIG. 12 is a table showing one exemplary operation of the fail memory unit shown in FIG. 11.

FIG. 12 is a table showing one exemplary operation of the fail memory unit 30 shown in FIG. 11. A case when each page group has 8 pages will be explained in this example. The fail memory unit 30 may have the same number of integrating sections 34 and the comparators 64 with the number of pages of the page group. This example may be explained on the assumption that the integral expected value of the data write time per page group is 8×600 μs.

The respective integrating sections 34 integrate the data write time of the page group each having 8 pages. Here, the page group corresponding to the respective integrating sections 34 may have pages partially overlapped. For example, the page group corresponding to the respective integrating sections 34 may be what its starting page is different by one page each as shown in FIG. 12.

The comparator 64 compares an integral value outputted out of the corresponding integrating section 34 with an integral expected value set in advance. Then, when all of the integral values outputted out of the plurality of comparators 64 is smaller than the integral expected value, the OR circuit 66 outputs a signal (logical value 0) indicating that the MUT 200 is defect-free. In FIG. 12, the integral value outputted out of the integrating section 34-4 is larger than the integral expected value, so that the OR circuit 66 outputs a signal (logical value 1) indicating that the MUT 200 is defective. Such test allows the MUT 200 that meets with the specification to be selected even when the page group is divided in any manner.

Although the invention has been described by way of the exemplary embodiments, it should be understood that those skilled in the art might make many changes and substitutions without departing from the spirit and scope of the invention.

It is obvious from the definition of the appended claims that the embodiments with such modifications also belong to the scope of the invention.

As it is apparent from the above description, the invention allows the MUTs 200 that meet with the required specification in the actual use to be selected with a better yield.

What is claimed is:

1. A testing apparatus for testing a memory-under-test, comprising:
   a writing section for writing preset test data into each page of said memory-under-test to test said memory-under-test; and
   a fail memory unit for storing the test result of said memory-under-test; wherein said fail memory unit further comprising:
   a write time measuring section for measuring a write time required for writing said test data per each of said pages;
   an integrating section for integrating said write time across a plurality of said pages set in advance; and
   a judging section for judging whether or not said memory-under-test is defect-free by comparing a value integrated by said integrating section with an expected value set in advance;
   wherein said integrating section integrates said write time per page group having said predetermined number of pages; and
   wherein said judging section judges whether or not said page group is defect-free based on an integral value of said write time per said page group.

2. The testing apparatus as set forth in claim 1, wherein said fail memory unit further includes a fail memory for storing the judgment result for each of said page groups while correlating with each of said page groups.

3. The testing apparatus as set forth in claim 1, wherein said fail memory unit further includes a subtracting section for inputting a differential value obtained by subtracting an average specification value set in advance from said write time to each of said page measured by said write time measuring section to said integrating section; and said judging section judges whether or not each of said page groups is defect-free based on whether or not an integral value of said differential value is smaller than zero.

4. The testing apparatus as set forth in claim 1, wherein said judging section has: a first judger for judging whether or not said integral value of said write time to each of said page groups is larger than an integral expected value set in advance per said page group; and a second judger for judging whether or not said write time to each of said pages contained in said respective page groups is larger than an absolute specification value set in advance.

5. The testing apparatus asset forth in claim 4, wherein said judging section has a third judger for judging for each of said page groups that the page group is a defect-free block when said integral value of said write time is smaller than said integral expected value and when the write time of all of said pages contained in said page group is smaller than said absolute specification value.

6. The testing apparatus as set forth in claim 5, wherein said fail memory unit further includes an integral expected value register for storing said integral expected value in advance to feed to said first judger; and an absolute specification value register for storing said absolute specification value in advance to feed to said second judger.

7. The testing apparatus as set forth in claim 4, wherein said fail memory unit further includes a page group control section that enables, when said second judger judges that said write time of either page is larger than said absolute specification value, said integrating section to integrate while excluding said write time of that page and that increments a page number of the last page in the page group by one.

8. The testing apparatus as set forth in claim 7, wherein said fail memory unit further includes a third judger that judges for each of said pages that the page is defect-free when said integral value of said page group to which said page belongs is judged to be less than said integral expected value and said write time is judged to be less than said absolute specification value; and a fail memory for storing the judgment result for each of said pages by correlating with said page.

9. The testing apparatus as set forth in claim 7, wherein fail memory unit further includes a page number register for storing said page number set in advance; a counter for counting a number of pulses of an enable signal synchronized almost with a write cycle of said test data of said writing section; and a resetting section for resetting the integral value of said integrating section and the counted value of said counter when the counted value of said counter coincides with the page number stored in said page number register; and when said write time of either one of said pages is judged to be larger than said absolute specification value by said second judger, said page group control section stops said counter from counting by one pulse of said enable signal and inhibits said integrating section from integrating said write time of that page.

10. The testing apparatus as set forth in claim 7, wherein said fail memory unit has first and second integrating sections provided in parallel; and said first page group for which said first integrating section integrates said write time and said second page group for which said second integrating section integrates said write time have pages partially overlapped each other.

11. The testing apparatus as set forth in claim 10, wherein said judging section judges that said memory-under-test is defect-free when all of the values integrated by said first and second integrating sections are smaller than said expected value.

12. A testing method for testing a memory-under-test, comprising:
   a writing step of writing preset test data to each page of said memory-under-test to test said memory-under-test; and
   a storage step of storing the test result of said memory-under-test; wherein said storage step further comprising:
   a write time measuring step of measuring a write time required for writing said test data per each of said pages;
   an integration step of integrating said write time across said plurality of pages set in advance; and
   a judging step of judging whether or not said memory-under-test is defect-free by comparing the value integrated in said integration step with an expected value set in advance;
   wherein said integration step further comprises integrating said write time per page group having said predetermined number of pages; and
   wherein said judging step further comprises judging whether or not said page group is defect-free based on an integral value of said write time per said page group.

* * * * *